US008024856B2

(12) United States Patent
Lee

(10) Patent No.: US 8,024,856 B2
(45) Date of Patent: Sep. 27, 2011

(54) METHOD FOR MANUFACTURING PRINTED CIRCUIT BOARD

(75) Inventor: Jong-Jin Lee, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 75 days.

(21) Appl. No.: 12/010,197

(22) Filed: Jan. 22, 2008

(65) Prior Publication Data

US 2009/0083976 A1    Apr. 2, 2009

(30) Foreign Application Priority Data

Sep. 28, 2007   (KR) .................. 10-2007-0098396

(51) Int. Cl.
*H05K 3/02*     (2006.01)
*H05K 3/10*     (2006.01)

(52) U.S. Cl. ............... 29/846; 29/827; 29/830; 29/840; 29/842; 205/125; 205/920; 174/260; 174/261; 174/262; 439/45; 439/75; 361/792; 361/760

(58) Field of Classification Search .............. 29/827, 29/830, 842, 840, 846; 205/125, 920; 361/792–795, 361/760; 174/260–262; 439/45, 75
See application file for complete search history.

(56) References Cited

U.S. PATENT DOCUMENTS

| | | | | |
|---|---|---|---|---|
| 6,455,784 | B1 * | 9/2002 | Kinoshita et al. | 174/257 |
| 6,694,613 | B2 * | 2/2004 | Nakamura et al. | 29/846 |
| 2002/0112879 | A1 * | 8/2002 | Iwashita et al. | 174/250 |
| 2004/0142161 | A1 * | 7/2004 | Kawakita et al. | 428/321.3 |
| 2006/0124351 | A1 * | 6/2006 | Kusano et al. | 174/261 |
| 2007/0045780 | A1 * | 3/2007 | Akram et al. | 257/621 |
| 2008/0052905 | A1 * | 3/2008 | Watanabe et al. | 29/846 |
| 2009/0056119 | A1 * | 3/2009 | Okabe et al. | 29/846 |

FOREIGN PATENT DOCUMENTS

| | | |
|---|---|---|
| JP | 10-70363 | 3/1998 |
| JP | 10-303561 | 11/1998 |
| JP | 2003-309370 | 10/2003 |
| JP | 2006-303056 | 11/2006 |
| JP | 2006-313945 | 11/2006 |
| JP | 2007-059529 | * 3/2007 |

OTHER PUBLICATIONS

Korean Office Action dated Oct. 30, 2008 issued in corresponding Korean Patent Application No. 10-2007-0098396.

* cited by examiner

*Primary Examiner* — A. Dexter Tugbang
*Assistant Examiner* — Jeffrey T Carley

(57) ABSTRACT

A method of manufacturing a printed circuit board is disclosed. A method of manufacturing a printed circuit board, which includes: forming at least one interlayer connector on a first carrier, stacking at least one insulation layer on the first carrier such that the interlayer connector is exposed, removing the first carrier, and forming at least one circuit pattern on the insulation layer such that the circuit pattern is electrically coupled with the interlayer connector, can be used to increase the density of circuit patterns, as the method can provide electrical connection between circuit patterns and vias without using lands.

5 Claims, 44 Drawing Sheets

METHOD FOR MANUFACTURING PRINTED CIRCUIT BOARD

CROSS-REFERENCE TO RELATED APPLICATIONS

This application claims the benefit of Korean Patent Application No. 10-2007-0098396 filed with the Korean Intellectual Property Office on Sep. 28, 2007, the disclosure of which is incorporated herein by reference in its entirety.

BACKGROUND

1. Technical Field

The present invention relates to a method for manufacturing a printed circuit board.

2. Description of the Related Art

With package products becoming smaller and smaller, so also are circuit widths and via land sizes continuously decreasing, in order that circuit densities may be increased. In response to these trends, most board companies are working on developments for reducing the sizes of via holes and increasing the accuracy with which to align a via hole and a via land.

FIG. 1 to FIG. 7 are cross-sectional views illustrating a method of manufacturing a printed circuit board according to the related art, and FIG. 8 is a perspective view illustrating a via and circuit patterns according to the related art. Referring to FIGS. 1 to 8, a copper clad laminate 6 may first be prepared, in which a copper foil layer 4 is formed on either side of an insulation layer 2. Next, a via hole 8 may be formed using a drill bit or a laser. When the via hole 8 is formed, the surfaces of the insulation layer and the inner perimeter of the via hole 8 may be plated with copper to form a copper layer 10, by subjecting the copper clad laminate 6 to electroless plating and then electroplating. Next, the circuit patterns 14 and via land 12 may be formed by coating a plating resist, exposing, developing, etching, and stripping off the plating resist. Next, a solder resist 16 may be coated, with only the portions where pads are to be formed opened, by a series of exposing, developing, and drying. Finally, the process of manufacturing a printed circuit board can be completed by gold plating the bonding pads 18 or solder ball pads 20.

With this method, the via lands 12 may be formed during the circuit-forming process, to prevent-short circuiting in the electrical connections. In forming the circuit patterns, the size of the via lands 12 may be determined by the size of the via holes 8 and the accuracy with which it is possible to align the via hole 8 and via land 12.

However, in order to reduce the size of a via hole and increase the alignment accuracy, high investments may be needed, such as in high-precision drilling equipment and exposure equipment, and manufacturing costs may be increased due to decreased productivity.

SUMMARY

An aspect of the invention is to provide a method of manufacturing a printed circuit board which can increase the density of circuit patterns, by providing electrical connection between a circuit pattern and a via without using a land.

One aspect of the invention provides a method of manufacturing a printed circuit board, which includes: forming at least one interlayer connector on a first carrier, stacking at least one insulation layer on the first carrier such that the interlayer connector is exposed, removing the first carrier, and forming at least one circuit pattern on the insulation layer such that the circuit pattern is electrically coupled with the interlayer connector.

Here, forming the interlayer connector can include: forming on the first carrier a plating resist, which is in correspondence with the interlayer connector; forming the interlayer connector by plating the first carrier; and removing the plating resist.

Also, forming the interlayer connector can include: forming on the first carrier a conductive paste bump, which is in correspondence with the interlayer connector; and curing the conductive paste bump to form the interlayer connector.

On the other hand, stacking the insulation layer can include: placing the insulation layer between the first carrier and a second carrier and pressing the first and second carriers together, while removing the first carrier can include: removing the first and second carriers.

Here, a metal layer may be formed on each of the first and second carriers, and the method may further include removing the metal layer, between the operations of removing the carrier and forming the circuit pattern.

In certain embodiments, the method may further include, after forming the circuit pattern: forming a solder resist that exposes at least one portion of the circuit pattern, and forming at least one pad by plating the at least one portion.

Another aspect of the invention provides a method of manufacturing a printed circuit board, which includes: providing a core substrate, on which a first circuit pattern is formed; forming at least one interlayer connector on the first circuit pattern; stacking at least one insulation layer on the core substrate such that the interlayer connector is exposed; and forming a second circuit pattern on the insulation layer such that the second circuit pattern is electrically coupled with the interlayer connector.

Here, forming the interlayer connector can include: forming on the core substrate a plating resist, which is in correspondence with the interlayer connector; forming the interlayer connector by plating the core substrate; and removing the plating resist.

Also, forming the interlayer connector can include: forming on the core substrate a conductive paste bump, which is in correspondence with the interlayer connector; and curing the conductive paste bump to form the interlayer connector.

On the other hand, stacking the insulation layer can include: placing the insulation layer between the core substrate and a carrier and pressing the core substrate and the carrier together, and the method may further include, before forming the second circuit pattern, removing the carrier.

Here, a metal layer may be formed on the carrier, and the method may further include removing the metal layer, between the operations of removing the carrier and forming the second circuit pattern.

In certain embodiments, the method may further include, after forming the second circuit pattern: forming a solder resist that exposes at least one portion of the second circuit pattern, and forming at least one pad by plating the at least one portion.

Additional aspects and advantages of the present invention will be set forth in part in the description which follows, and in part will be obvious from the description, or may be learned by practice of the invention.

DETAILED DESCRIPTION

Figure 1:
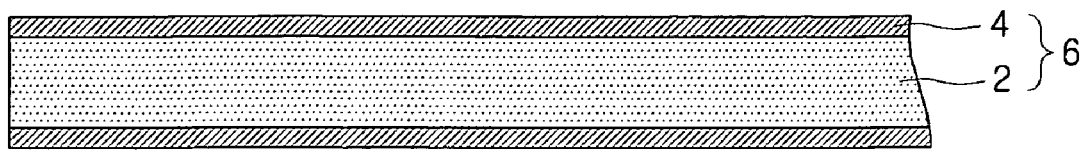
FIG. 1, FIG. 2, FIG. 3, FIG. 4, FIG. 5, FIG. 6, and FIG. 7 are cross-sectional views illustrating a method of manufacturing a printed circuit board according to the related art.
Figure 2:
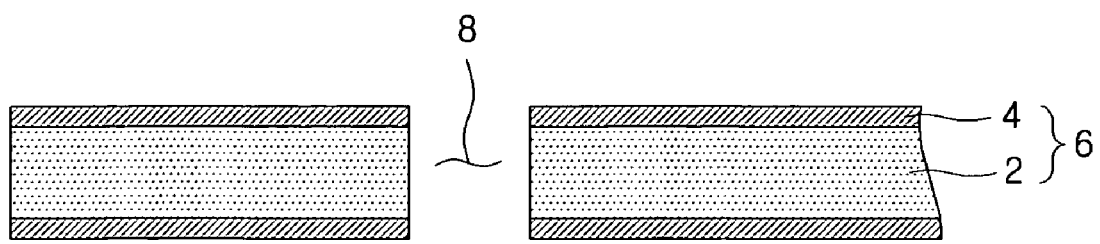
Figure 3:
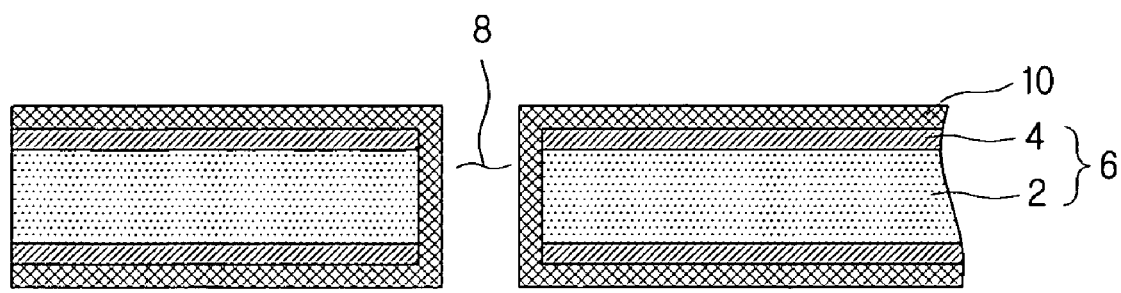
Figure 4:
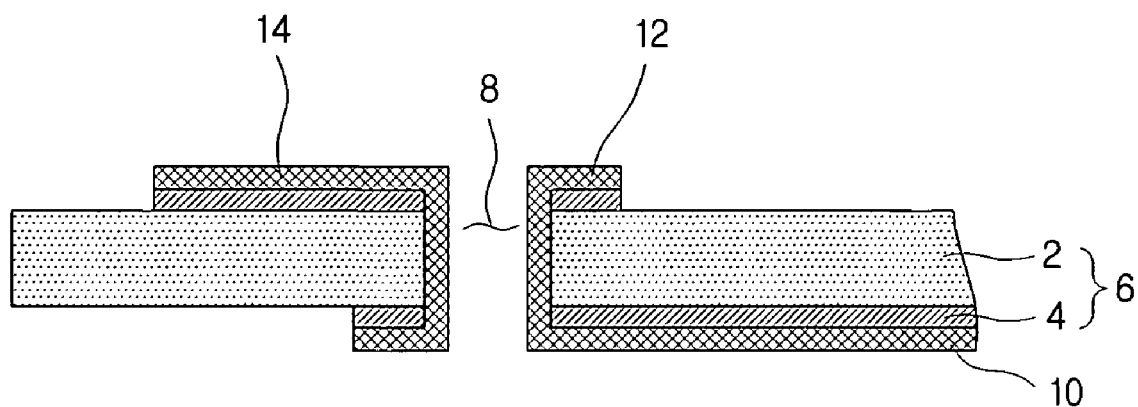
Figure 5:
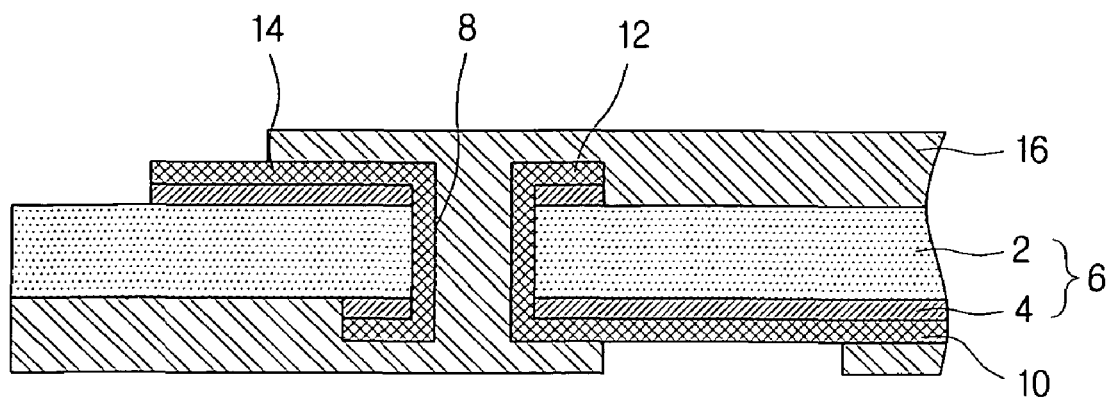
Figure 6:
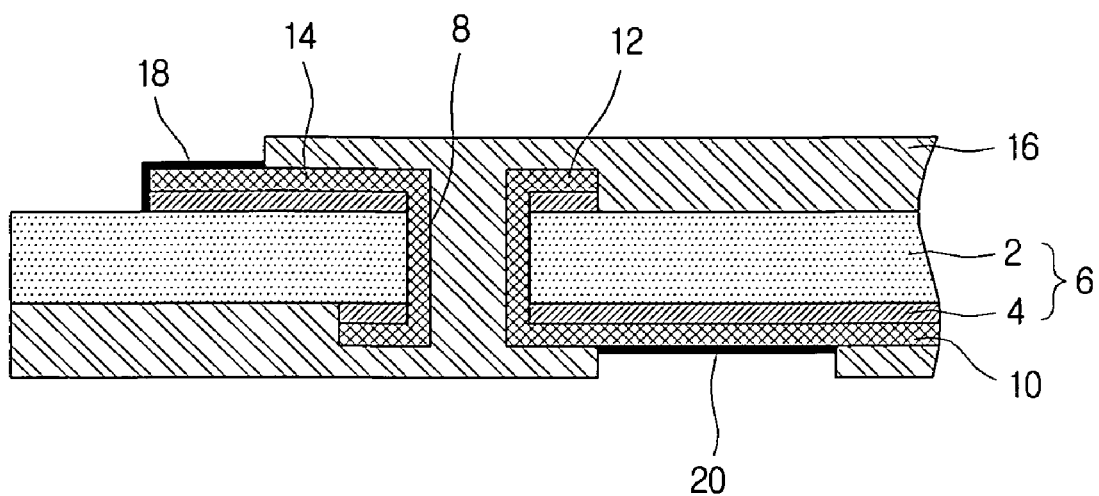
Figure 7:
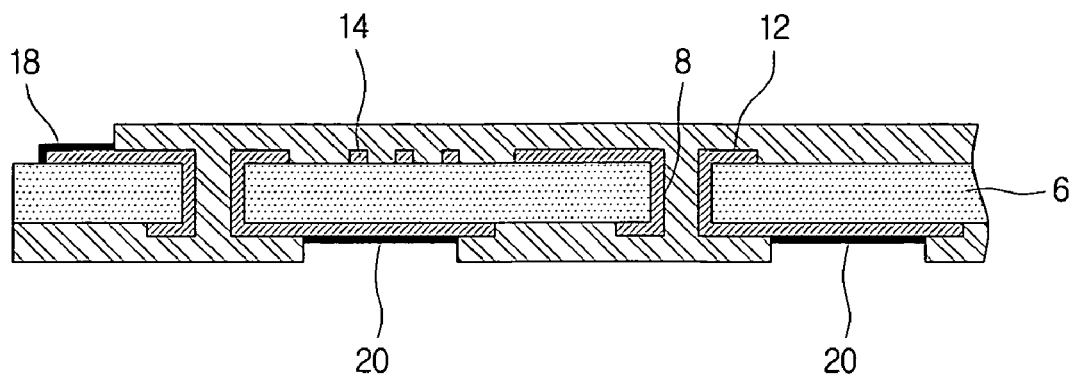
Figure 8:
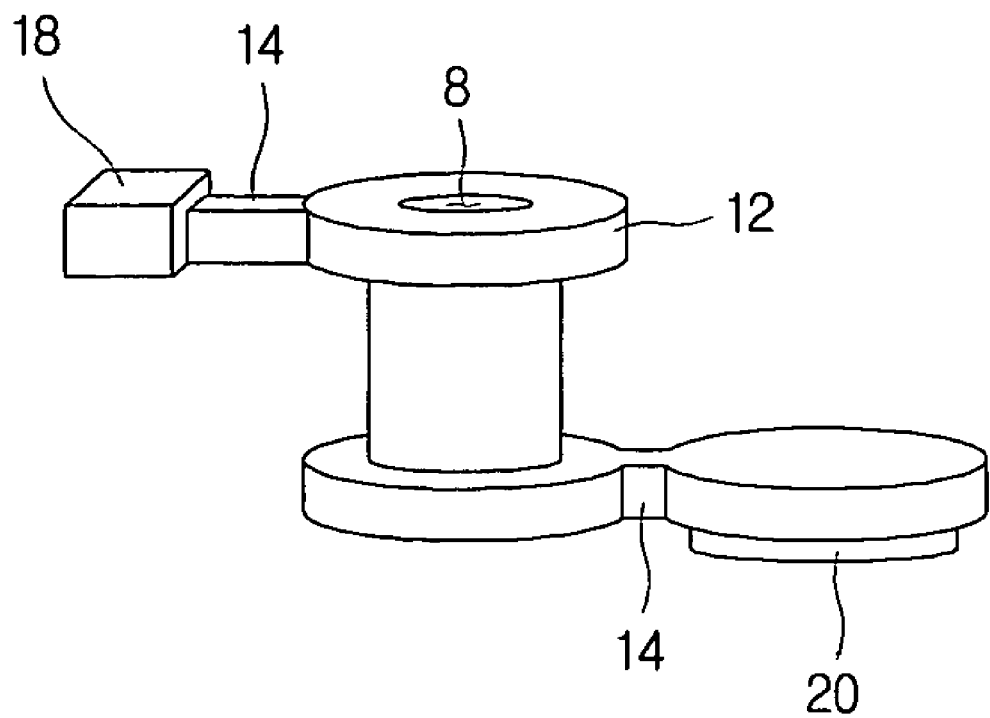
FIG. 8 is a perspective view illustrating a via and circuit patterns according to the related art.

The method of manufacturing a printed circuit board according to certain embodiments of the invention will now be described below in more detail with reference to the accompanying drawings, in which those components are rendered the same reference numeral that are the same or are in correspondence, regardless of the figure number, and redundant explanations are omitted.

Figure 9:
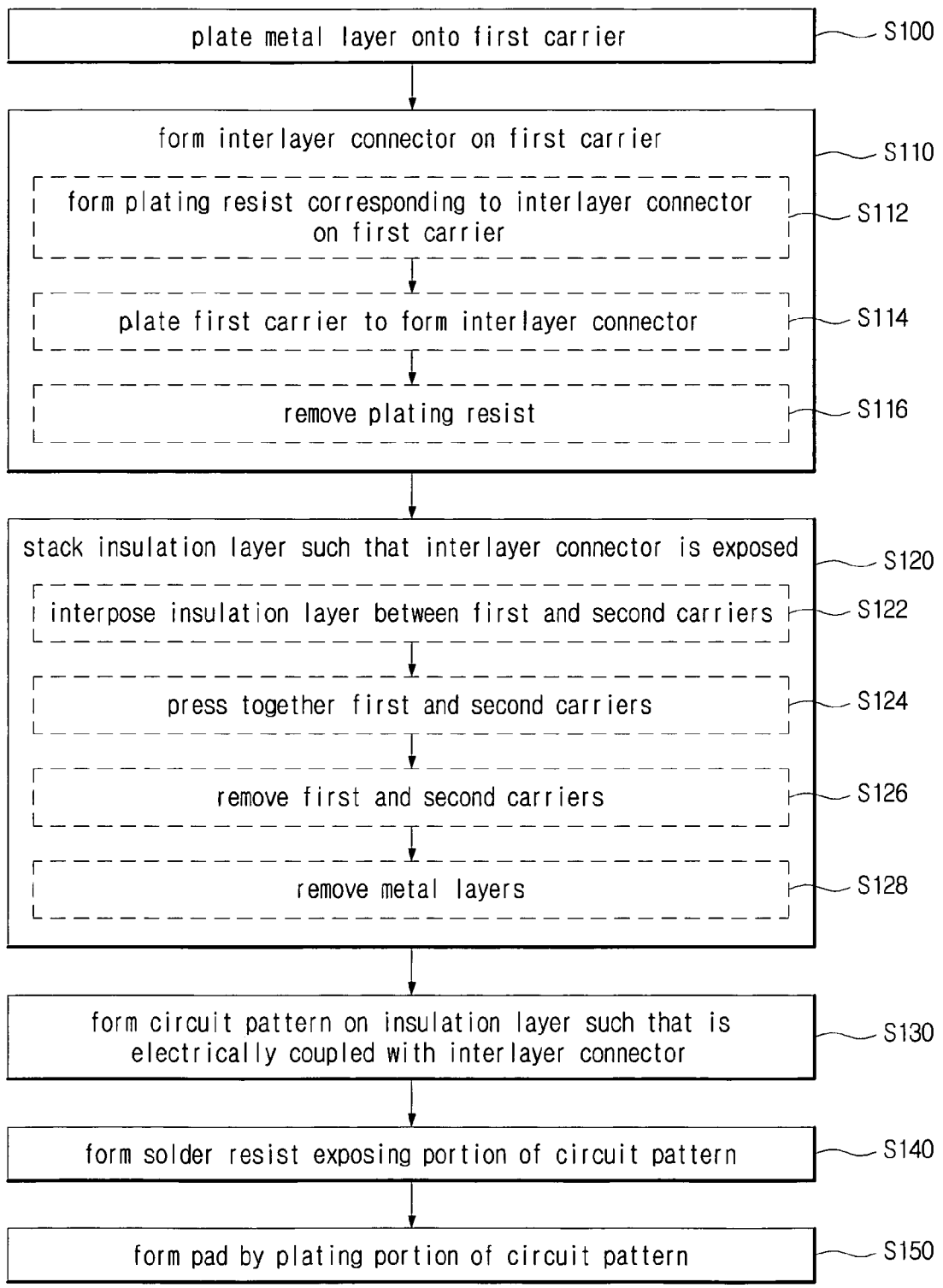
FIG. 9 is a flowchart illustrating a method of manufacturing a printed circuit board according to an embodiment of the invention.

FIG. 9 is a flowchart illustrating a method of manufacturing a printed circuit board according to an embodiment of the invention, and FIG. 10 to FIG. 19 are cross-sectional views illustrating a method of manufacturing a printed circuit board according to an embodiment of the invention. In FIGS. 10 to 19 are illustrated copper foils 100, a first carrier 104, metal layers 102, an interlayer connector 106, an insulation layer 108, a second carrier 112, circuit patterns 114, a wire bonding pad 120, and a solder ball pad 118.

A method of manufacturing a printed circuit board according to an embodiment of the invention may include forming an interlayer connector 106 on a first carrier 104, stacking an insulation layer 108 on the first carrier 104 such that the interlayer connector 106 is exposed, removing the first carrier 104, and forming a circuit pattern 114 on the insulation layer 108 to be electrically coupled with the interlayer connector 106. This method can increase the density of circuit patterns 114 by providing electrical connections between the circuit patterns 114 and vias without using lands.

Figure 10:
FIG. 10, FIG. 11, FIG. 12, FIG. 13, FIG. 14, FIG. 15, FIG. 16, FIG. 17, FIG. 18, and FIG. 19 are cross-sectional views illustrating a method of manufacturing a printed circuit board according to an embodiment of the invention.
Figure 11:

First, a metal layer 102 may be plated on a first carrier 104 (S100). As illustrated in FIG. 10, the first carrier 104 may be a support on which the interlayer connector 106 can be formed, and may, for example, be a copper (Cu) foil 100. As illustrated in FIG. 11, the metal layer 102 may be plated onto a surface of the first carrier 104. The metal layer 102 can serve as a seed layer when plating on the interlayer connectors 106. The metal layer 102 can be made of nickel (Ni), for example.

While the first carrier 104 can be formed, as in this embodiment, by plating a metal layer 102 onto a copper foil 100, the operation of plating on the metal layer 102 can be omitted, in cases where the first carrier 104 is provided with a metal layer 102 already formed.

Next, an interlayer connector 106 may be formed on the first carrier 104 (S110). In order to form the interlayer connector 106, a plating resist corresponding with the interlayer connector 106 may first be formed on the first carrier 104 (S112). The plating resist may be formed on a surface of the first carrier 104 such that a portion of the first carrier 104 exposed in a position where the interlayer connector 106 is to be formed. A dry film, for example, can be used for the plating resist. The plating resist may be formed on the first carrier 104 by a process of exposure and development.

Figure 12:
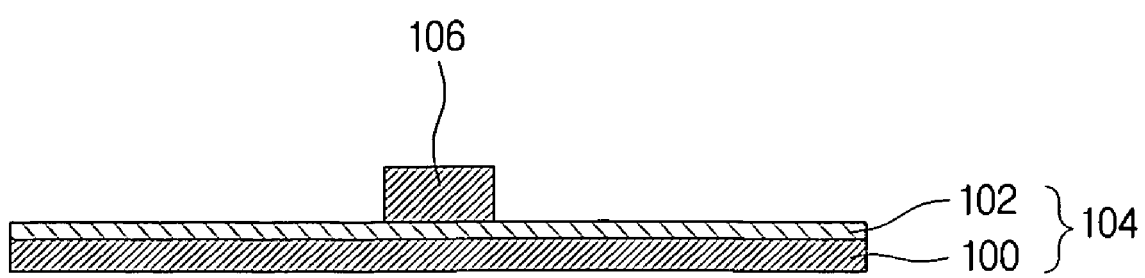

Next, the interlayer connector 106 may be formed by plating the first carrier 104 (S114). As illustrated in FIG. 12, the first carrier 104 having a plating resist formed in correspondence with the interlayer connector 106 can be plated, such that the interlayer connector 106 may be formed, for example, in the shape of a copper post. Here, electroplating may be employed, using the metal layer 102 plated on the first carrier 104 as a seed layer.

Next, the plating resist may be removed (S116). If a dry film is used for the plating resist, as mentioned above, the plating resist can be removed using a resist stripper containing sodium hydroxide.

Figure 13:
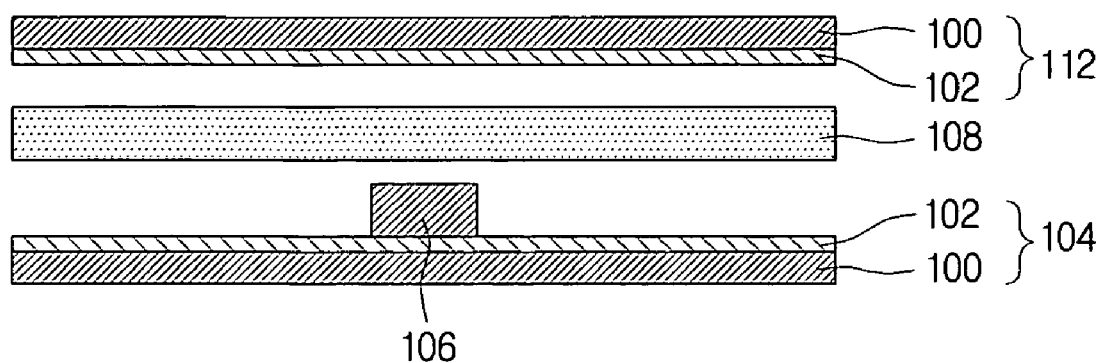

Next, an insulation layer 108 may be stacked such that the interlayer connector 106 is exposed (S120). To stack the insulation layer 108, the insulation layer 108 may first be interposed between the first carrier 104 and a second carrier 112 (S122). Similar to the first carrier 104, the second carrier 112 can be formed by forming a metal layer 102 of nickel, etc., on a surface of a copper foil 100. As illustrated in FIG. 13, the insulation layer 108 may be placed between the first and second carriers 104, 112 after having the metal layers 102 of the first and second carriers 104, 112 face the insulation layer 108. The insulation layer 108 may be advantageously interposed to be in a desired alignment in relation to the first and second carriers 104, 112.

Figure 14:
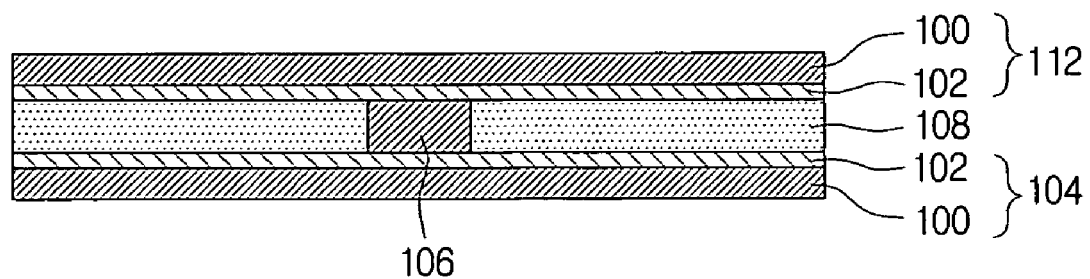

Next, the first and second carriers 104, 112 may be pressed together (S124). As illustrated in FIG. 14, the first and second carriers 104, 112 may be pressed together with the insulation layer 108 interposed in-between, to integrate the first and second carriers 104, 112 with the insulation layer 108. The insulation layer 108 can be made, for example, from a thermosetting resin, in which case the pressing can be performed with the temperature increased to a degree that keeps the thermosetting resin in a deformable state. The pressing operation may be performed to such an extent that the interlayer connector 106 passes through the insulation layer 108 and is placed in physical contact against the second carrier 112.

Conversely, in cases where the insulation layer 108 is stacked without using a jig, etc., instead of using a second carrier 112 as in this particular embodiment, the pressing may be performed such that the interlayer connector 106 exposed at the insulation layer 108 has a height that is substantially level with the surface of the insulation layer 108. Also, in order to match the heights of the insulation layer 108 and the interlayer connector 106, a physical or chemical surface-treatment may be applied, after the operation described later of removing the metal layers 102, to implement equal heights for the insulation layer 108 and interlayer connector 106.

Figure 15:
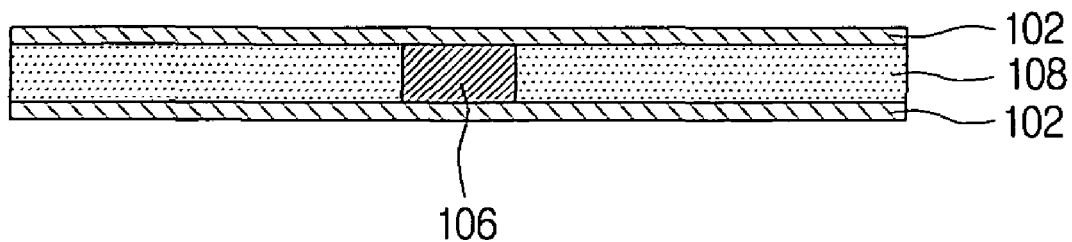

Next, the first and second carriers 104, 112 may be removed (S126). As illustrated in FIG. 15, the first and second carriers 104, 112 may be removed to expose the metal layers 102 on the exterior of the insulation layer 108. The method of removing the carriers may vary according to the stripping characteristics of each carrier. If the carrier is a copper foil 100, as described above, the carrier can be removed using an etchant such as copper chloride ($CuCl_2$), that is capable of etching copper.

Figure 16:
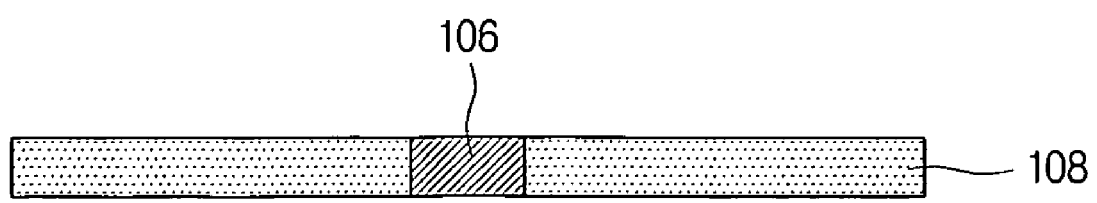

Next, the metal layers 102 may be removed (S128). As illustrated in FIG. 16, the metal layers 102 on the outermost positions of the insulation layer 108 may be removed, so that the ends of the interlayer connector 106 may be exposed. If a metal layer 102 is made of nickel, as described above, the metal layer 102 can be removed using an etchant such as nitric acid ($HNO_3$), that is capable of etching nickel.

Here, the metal layer 102 made of nickel may also serve to protect the interlayer connector 106 made of copper, during the procedure for removing the first and second carriers 104, 112 made of copper, as described above. As such, the metal layer 102 may be used as a seed layer in plating the interlayer connector 106, and may react to a different etchant from that used for etching the first and second carriers 104, 112, thus acting also as a barrier for protecting the interlayer connector 106, if the first and second carriers 104, 112 are removed by a chemical method.

Conversely, if the first and second carriers 104, 112 are made of materials that react to different etchant from that used for etching interlayer connector 106, or if the first and second carriers 104, 112 can be removed by a physical method, the metal layers 102 may not need to be formed on the first and second carriers 104, 112.

Figure 17:
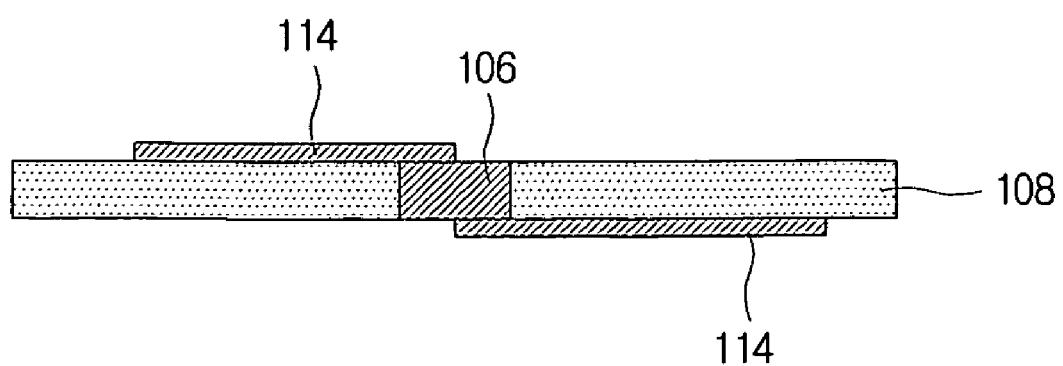

Next, a circuit pattern 114 may be formed on the insulation layer 108 such that is electrically coupled with the interlayer connector 106 (S130). To form the circuit pattern 114 on the insulation layer 108, electroless copper plating may be performed on the insulation layer 108, after which a plating resist corresponding to the circuit pattern 114 may be formed. After exposing and developing the plating resist, copper electroplating may be performed. After the copper electroplating, the plating resist corresponding to the circuit pattern 114 may be removed to form the circuit pattern 114. As illustrated in FIG. 17, the circuit pattern 114 can be formed to pass the interlayer connector 106, in order that the circuit pattern 14 is electrically connected with the interlayer connector formed on the insulation layer 108.

Figure 18:
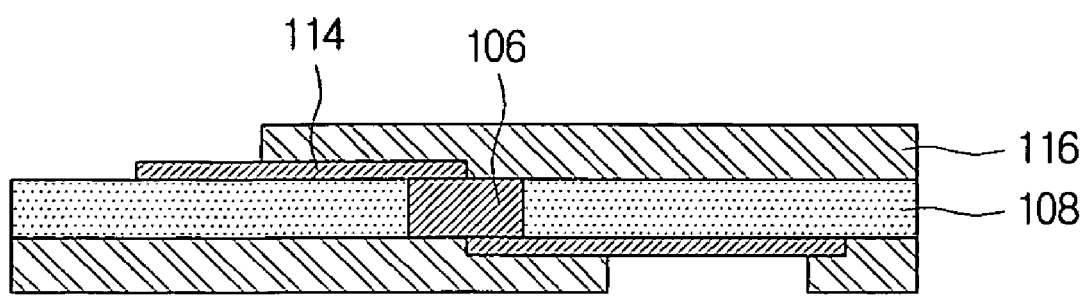

Next, a solder resist 116 may be formed that exposes portions of the circuit pattern 114 (S140). If the printed circuit board is to have electrical connections with a semiconductor chip, etc., or another printed circuit board, wire bonding pads 120 or solder ball pads 118, etc., may be formed on the printed circuit board. As illustrated in FIG. 18, the solder resist 116 may be coated on the printed circuit board in positions corresponding to where such pads will be formed, and the portions of the printed circuit board where the pads will be formed may be exposed by a series of treatment including exposure, development, and drying, etc.

Figure 19:
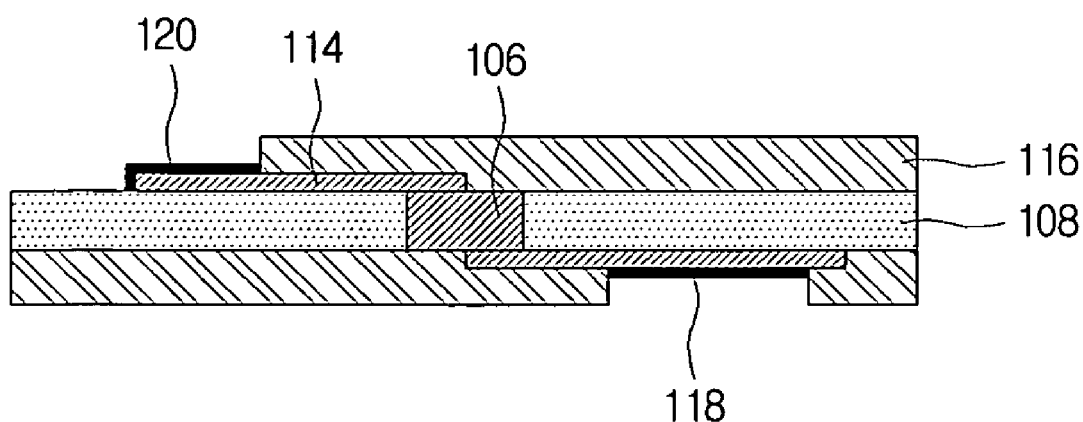

Next, the portions of the circuit pattern 114 may be plated to form the pads (S150). As illustrated in FIG. 19, plating may be performed, such as nickel or gold electroplating, etc., in the regions where the pads will be formed, using a material that enables electrical connection with the pads.

Figure 20:
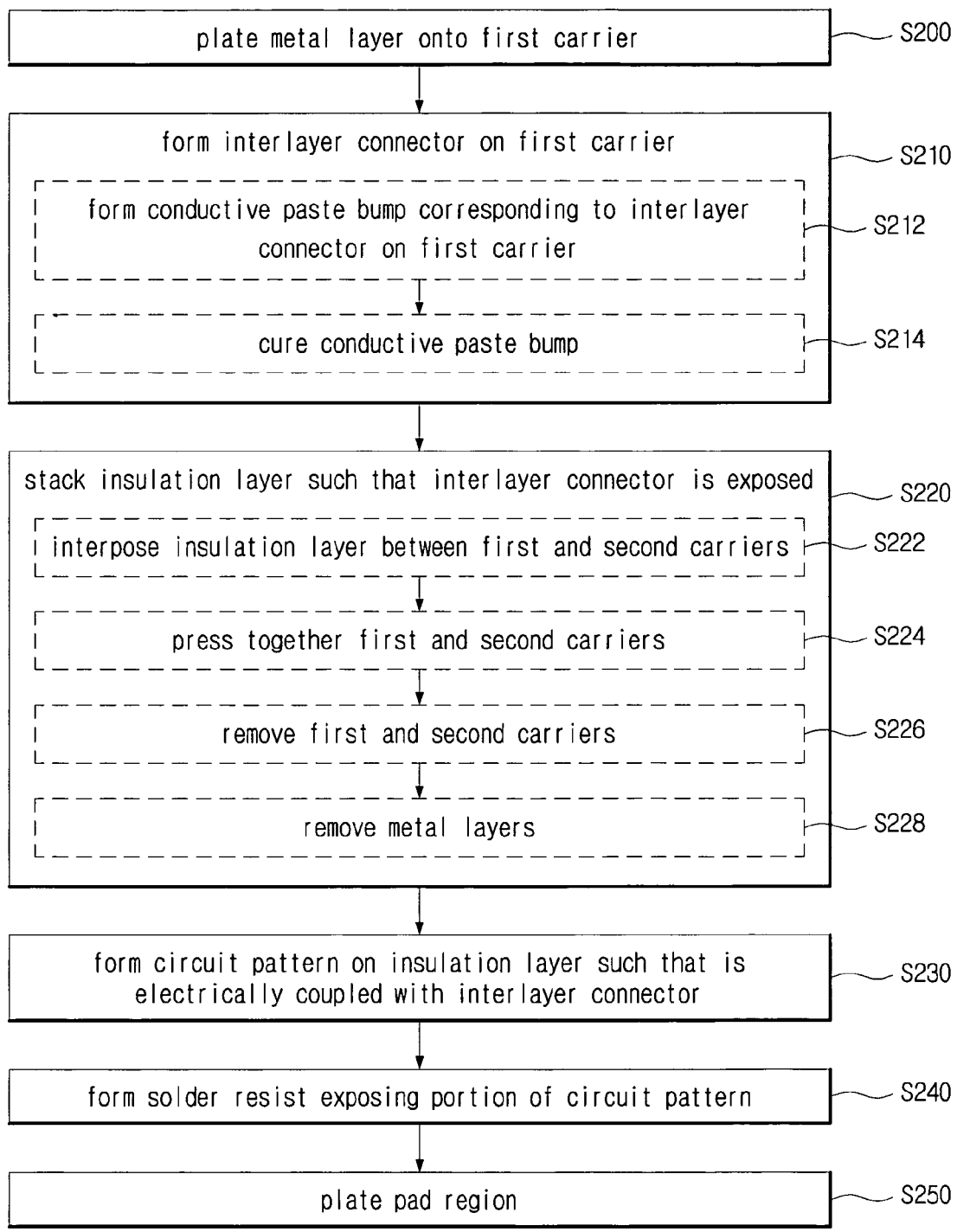
FIG. 20 is a flowchart illustrating a method of manufacturing a printed circuit board according to another embodiment of the invention.

FIG. 20 is a flowchart illustrating a method of manufacturing a printed circuit board according to another embodiment of the invention, and FIG. 21 to FIG. 30 are cross-sectional views illustrating a method of manufacturing a printed circuit board according to another embodiment of the invention. In FIGS. 21 to 30 are illustrated copper foils 100, a first carrier 104, metal layers 102, an interlayer connector 106, an insulation layer 108, a second carrier 112, circuit patterns 114, a wire bonding pad 120, a solder ball pad 118, and solder resists 116.

In a method of manufacturing a printed circuit board according to this embodiment, forming the interlayer connector 106 may include forming on a first carrier a conductive paste bump, which is in correspondence with the interlayer connector 106, and curing the conductive paste bump to form the interlayer connector 106. Using this method, the density of circuit patterns 114 may be increased by providing electrical connections between the circuit patterns 114 and vias without using lands.

Figure 21:
FIG. 21, FIG. 22, FIG. 23, FIG. 24, FIG. 25, FIG. 26, FIG. 27, FIG. 28, FIG. 29, and FIG. 30 are cross-sectional views illustrating a method of manufacturing a printed circuit board according to another embodiment of the invention.
Figure 22:

First, a metal layer 102 may be plated on a first carrier 104 (S200). As illustrated in FIG. 21, the first carrier 104 may be substantially the same as the first carrier 104 of the embodiment described above. As illustrated in FIG. 22, the metal layer 102 may be plated onto a surface of the first carrier 104. The metal layer 102 can be made of nickel (Ni), for example.

Figure 23:
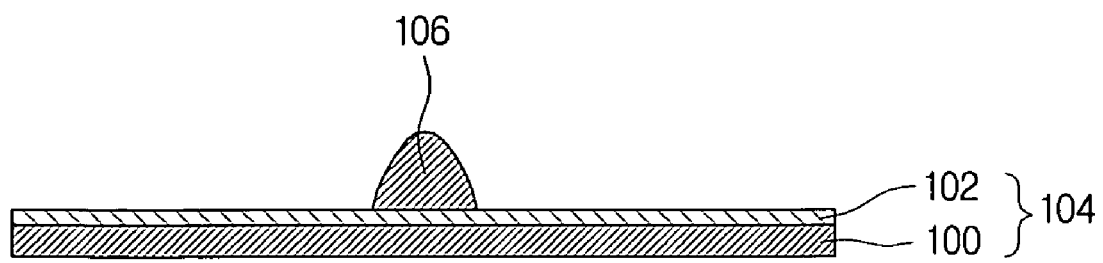

Next, the interlayer connector 106 may be formed on the first carrier 104 (S210). As illustrated in FIG. 23, in order to form the interlayer connector 106, a conductive paste bump corresponding with the interlayer connector 106 may first be formed on the first carrier 104 (S212). The conductive paste bump can contain silver or copper, etc. The conductive paste bump can be printed in a position on a surface of the first carrier 104 where the interlayer connector 106 is to be formed.

Next, the conductive paste bump may be cured (S214). By curing the conductive paste bump printed on the surface of the first carrier, the conductive paste bump can be made sufficiently hard to penetrate the insulation layer 108 in the pressing operation described later.

Figure 24:
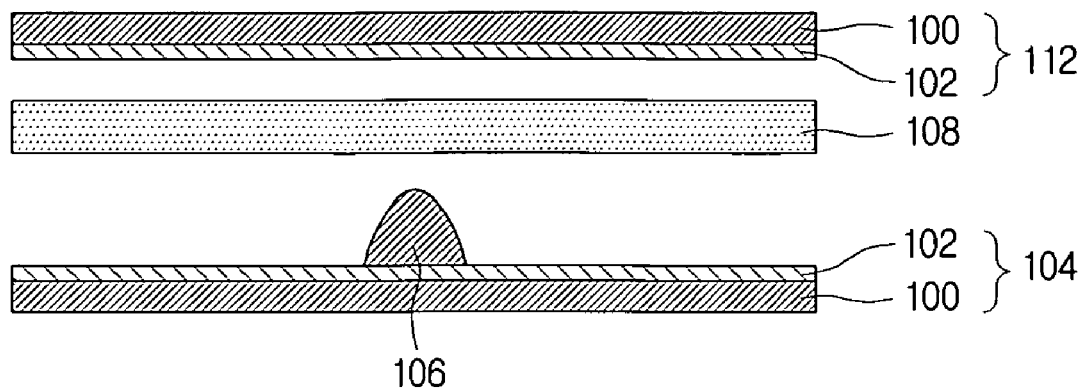
Figure 25:
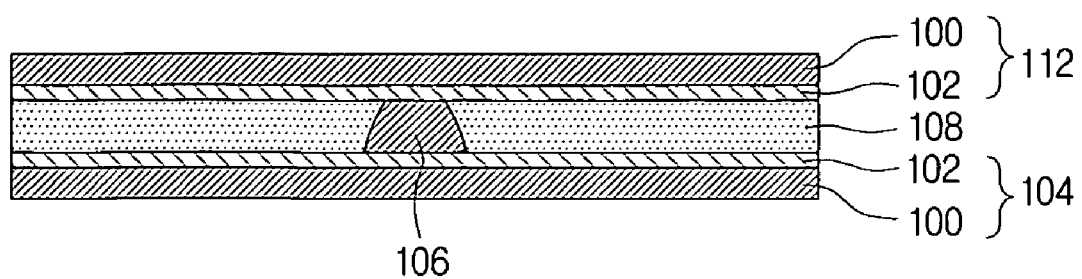

Next, an insulation layer 108 may be stacked on the first carrier 104 such that the interlayer connector 106 is exposed (S220). To stack the insulation layer 108, as illustrated in FIG. 24, the insulation layer 108 may first be interposed between the first carrier 104 and a second carrier 112 (S222). Similar to the first carrier 104, the second carrier 112 can be formed by forming a metal layer 102 of nickel, etc., on a surface of a copper foil 100. The insulation layer 108 may be placed between the first and second carriers 104, 112 with the metal layers 102 of the first and second carriers 104, 112 facing the insulation layer 108.

Figure 26:
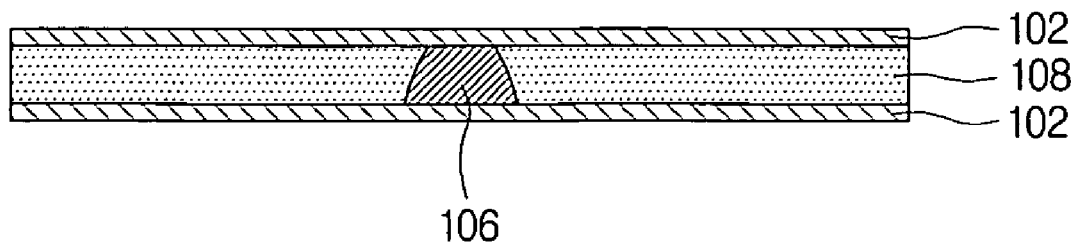

Next, the first and second carriers 104, 112 may be pressed together (S224). The pressing environment may involve performing the pressing with the insulation layer 108 heated, as described above. As illustrated in FIG. 26, the pressing may be performed such that the end of the interlayer connector 106 penetrates the insulation layer 108 and is exposed at a surface of the insulation layer 108. The end of the interlayer connector 106 may be pressed by the second carrier 112 to form a circular cross section.

In this embodiment also, the insulation layer 108 may be stacked without using the second carrier 112, as described above, and may be treated with a physical or chemical surface-treatment process.

Next, the first and second carriers 104, 112 may be removed (S226). As illustrated in FIG. 26, the first and second carriers 104, 112 may be removed to expose the metal layers 102 on the exterior of the insulation layer 108. The method of removing the carriers may be as described above.

Figure 27:
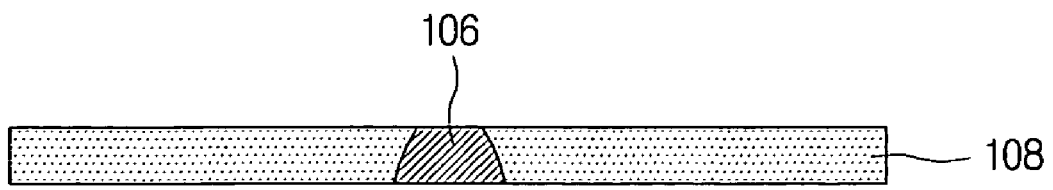

Next, the metal layers 102 may be removed (S228). As illustrated in FIG. 27, the metal layers 102 formed on the outsides of the insulation layer 108 may be removed to expose both ends of the interlayer connector 106 formed on the inside of the insulation layer 108. The method of removing the metal layers 102 may be as described above.

Figure 28:
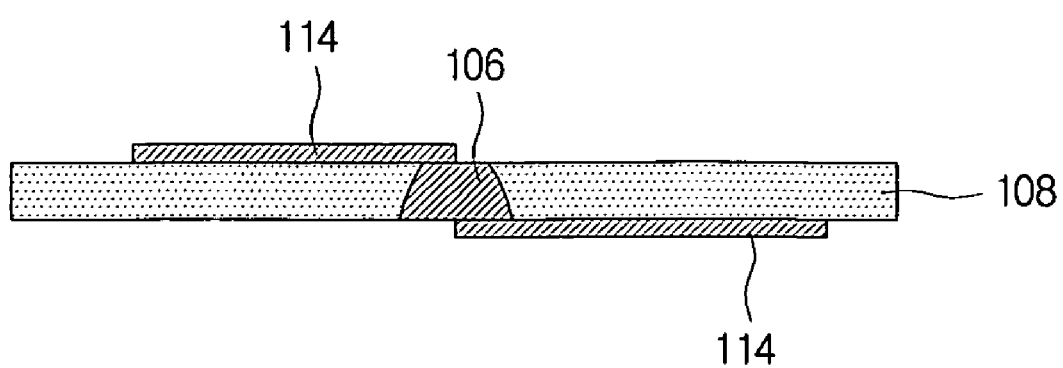
Figure 29:
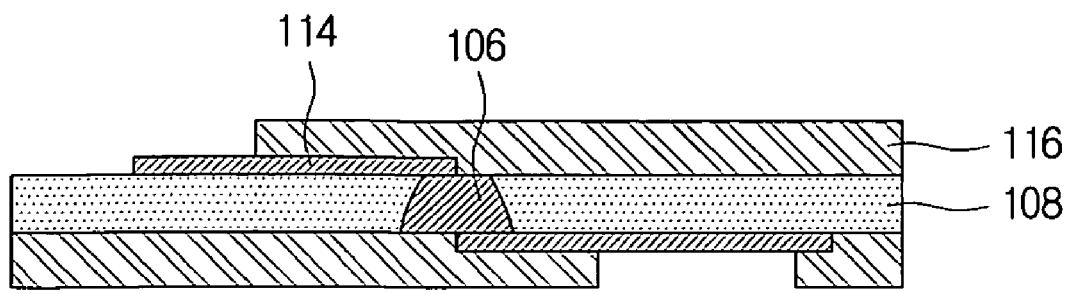
Figure 30:
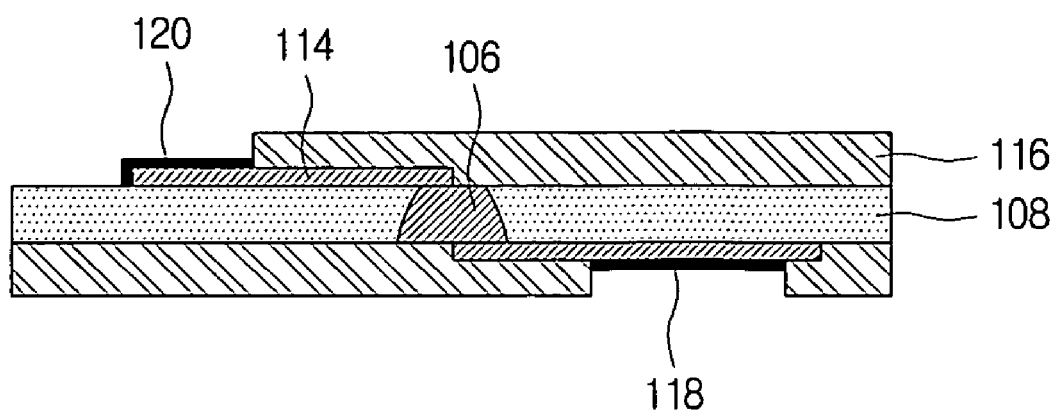

Next, as illustrated in FIGS. 28 to 30, a circuit pattern 114 may be formed on the insulation layer 108 such that is electrically coupled with the interlayer connector 106 (S230), and a solder resist 116 may be formed that exposes portions of the circuit pattern 114, i.e. regions corresponding to the regions in which the pads will be formed (S240). Then, the portions of the circuit pattern 114, i.e. the pad regions, may be plated to form the pads (S250). The operations of forming the circuit patterns 114, forming the solder resist 116, and plating the pads can be substantially the same as the operations in the previous embodiment described above.

Figure 31:
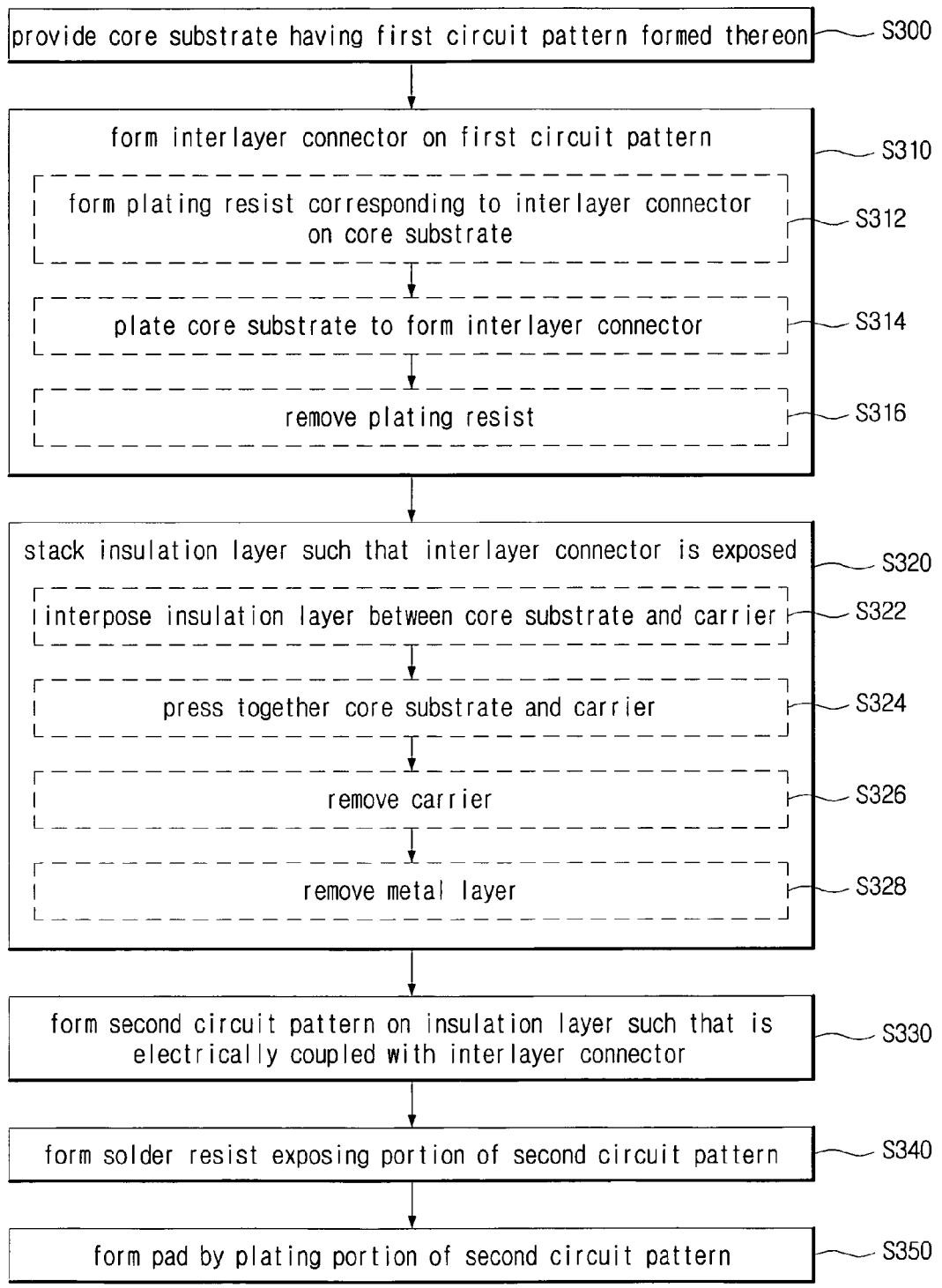
FIG. 31 is a flowchart illustrating a method of manufacturing a printed circuit board according to yet another embodiment of the invention.

FIG. 31 is a flowchart illustrating a method of manufacturing a printed circuit board according to yet another embodiment of the invention, and FIG. 32 to FIG. 40 are cross-sectional views illustrating a method of manufacturing a printed circuit board according to yet another embodiment of the invention. In FIGS. 32 to 40 are illustrated a core substrate 130, first circuit patterns 132, second circuit patterns 134, a first carrier 104, copper foils 100, metal layers 102, insulation layers 108, interlayer connectors 106, a second carrier 112, a wire bonding pad 120, solder ball pads 118, and solder resists 116.

A method of manufacturing a printed circuit board according to this embodiment may include providing a core substrate 130 on which first circuit patterns 132 are formed, forming interlayer connectors 106 on the first circuit patterns 132, stacking insulation layers 108 on the core substrate 130 such that the interlayer connectors 106 are exposed, and forming second circuit patterns 134 on the insulation layer 108 such that the second circuit patterns 134 are electrically coupled with the interlayer connectors 106. This method may also increase the density of circuit patterns by providing electrical connections between the circuit patterns and vias without using lands.

Figure 32:
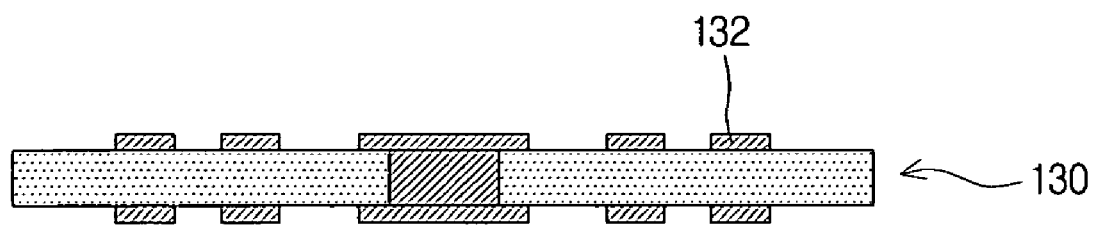
FIG. 32, FIG. 33, FIG. 34, FIG. 35, FIG. 36, FIG. 37, FIG. 38, FIG. 39, and FIG. 40 are cross-sectional views illustrating a method of manufacturing a printed circuit board according to yet another embodiment of the invention.

First, a core substrate 130 may be provided on which a first circuit pattern 132 is formed (S300). As illustrated in FIG. 32, the core substrate 130 can have a first circuit pattern 132 formed on one or either surface of an insulating body. In cases where the first circuit pattern 132 is formed on either surface of the core substrate 130, one or more vias may be formed to provide an electrical connection between the first circuit patterns 132. The first circuit pattern 132 may be designed in consideration of the positions where the interlayer connectors 106 are to be formed. The core substrate 130 may be formed according to the embodiment of the invention described above, or may be formed according to a method used in prior art.

Next, the interlayer connectors 106 may be formed on the first circuit patterns 132 (S310). To form the interlayer connectors 106, plating resists may first be formed on the core substrate 130 that correspond with the interlayer connectors 106 (S312). The plating resist may expose to the exterior those portions of the core substrate 130 on which the interlayer connectors 106 will be formed. A dry film, for example, can be used for the plating resist. The plating resist may be formed on the core substrate 130 by a process of exposure and development. If there are first circuit patterns 132 formed on both sides of the core substrate 130, as illustrated in FIG. 32, then there may also be plating resists formed on both sides of the core substrate 130.

Figure 33:
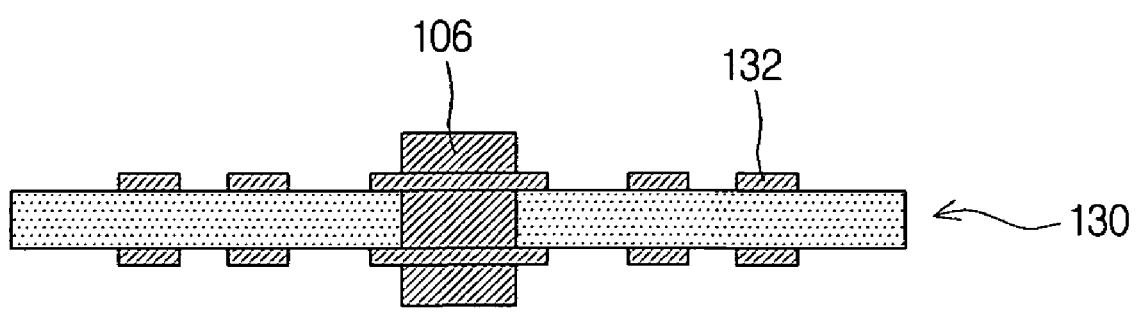
Figure 34:
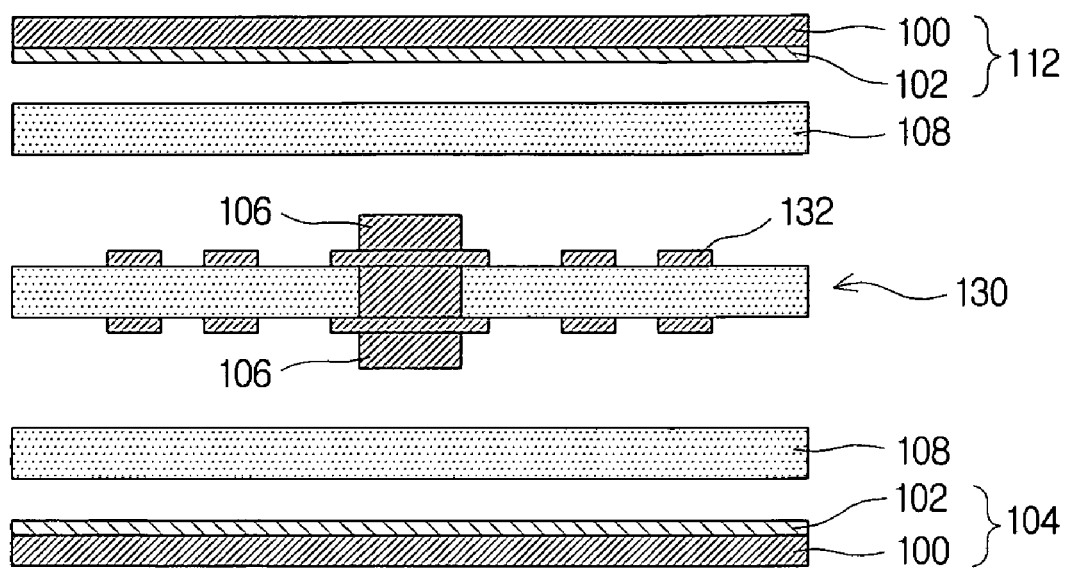
Figure 35:
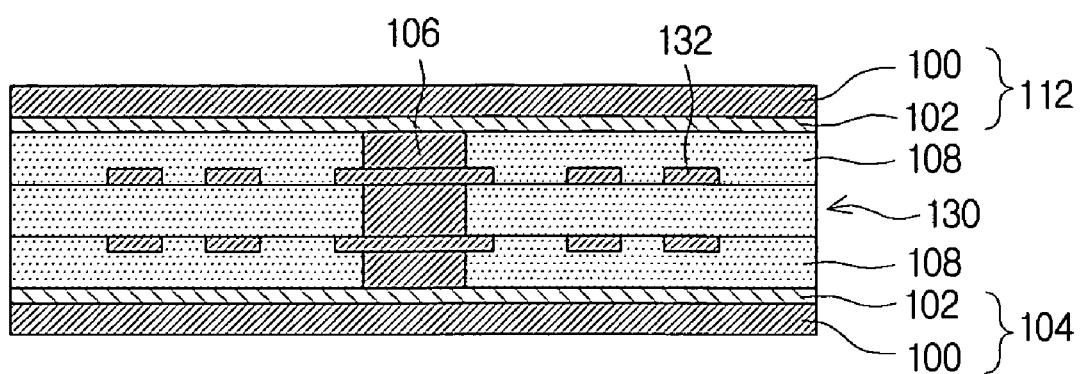
Figure 36:
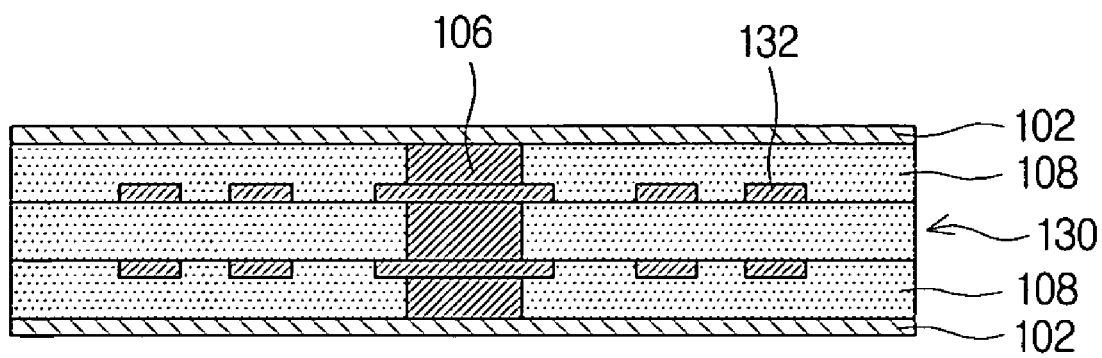
Figure 37:
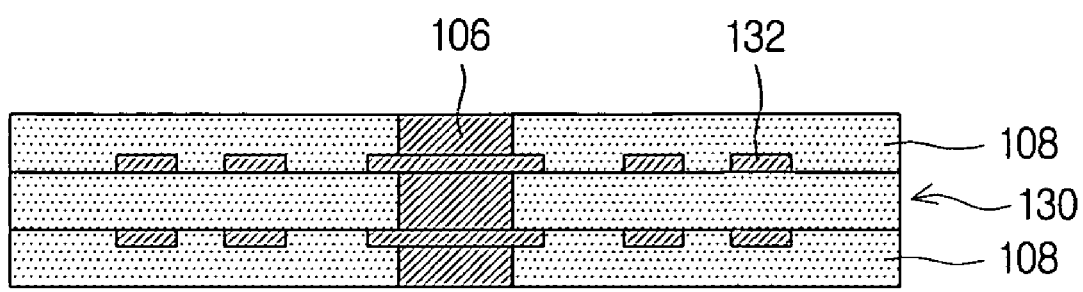

Next, the interlayer connectors 106 may be formed by plating the core substrate 130 (S314). As illustrated in FIG. 33, the core substrate 130 can be plated to form the interlayer connectors 106, for example, in the shape of copper posts.

Next, the plating resists may be removed (S316). If a dry film is used for the plating resist, as mentioned above, the plating resist can be removed using a resist stripper containing sodium hydroxide.

While this embodiment illustrates interlayer connectors 106 formed using plating, the interlayer connectors 106 may just as well be formed by forming conductive paste bumps, as in one of the previous embodiments of the invention described above.

Next, insulation layers 108 may be stacked such that the interlayer connectors 106 are exposed (S320). To stack the insulation layers 108, as illustrated in FIGS. 34 to 37, the insulation layers 108 may first be interposed between the core substrate 130 and carriers 112 having metal layers 102. That is, the insulation layers 108 may be interposed between a first and a second carrier 104, 112 (S322), and the core substrate 130 and the first and second carriers 104, 112 may be pressed together (S324). Next, the first and second carriers 104, 112 may be removed (S326), and the metal layers 102 may be removed (S328). The operations for stacking the insulation layers 108 (S320) may be substantially the same as the operations for stacking the insulation layer 108 (S120) in the embodiment of the invention described above.

Figure 38:
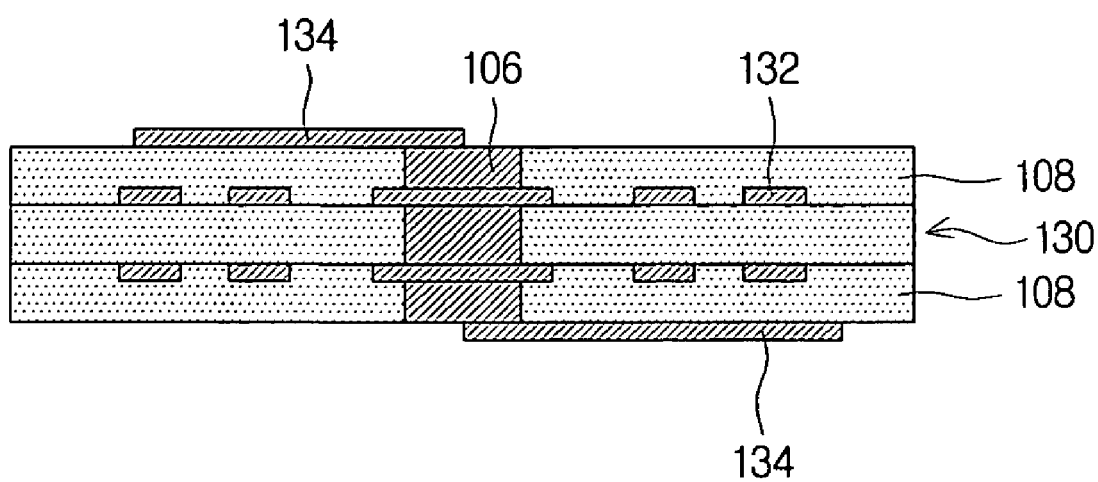
Figure 39:
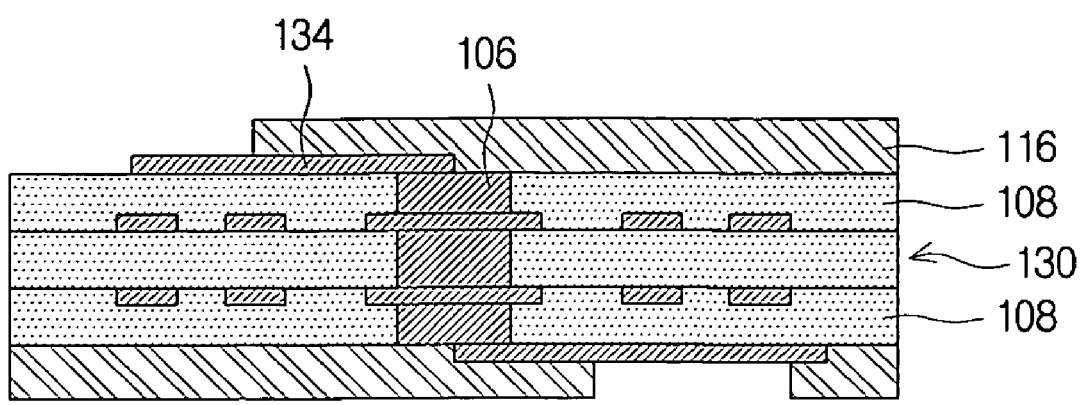
Figure 40:
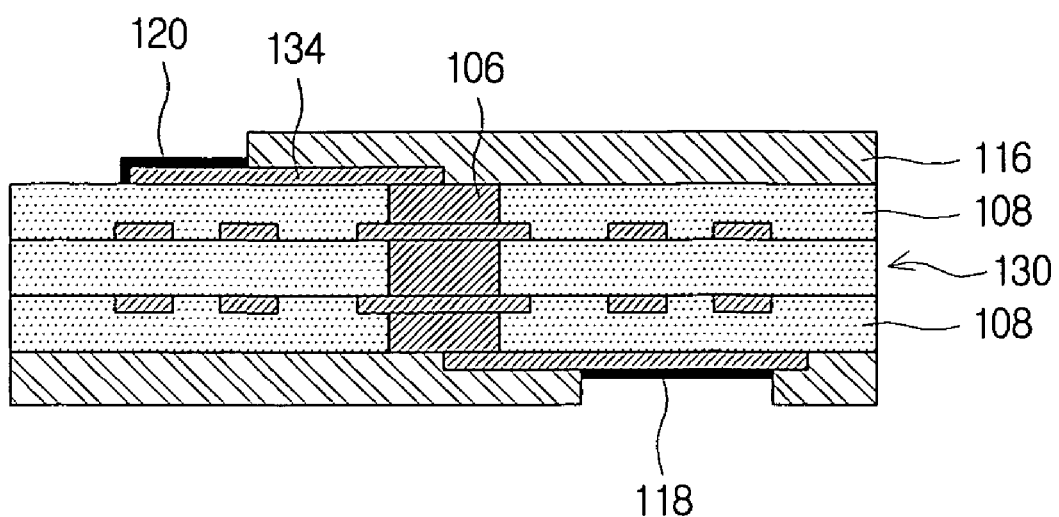

Next, as illustrated in FIG. 38 to FIG. 40, circuit patterns may be formed on the insulation layers 108 such that are electrically coupled with the interlayer connectors 106 (S330), and solder resists 116 may be formed that expose portions of the circuit patterns, that is, the regions corresponding to those regions on which the pads will be formed (S340). Then, the portions of the circuit pattern, i.e. the pad regions, may be plated to form the pads (S350). The operations for forming the circuit patterns, forming the solder resists 116, and plating the pads may be performed in substantially the same way as for the operations of the embodiment of the invention described above.

Figure 41:
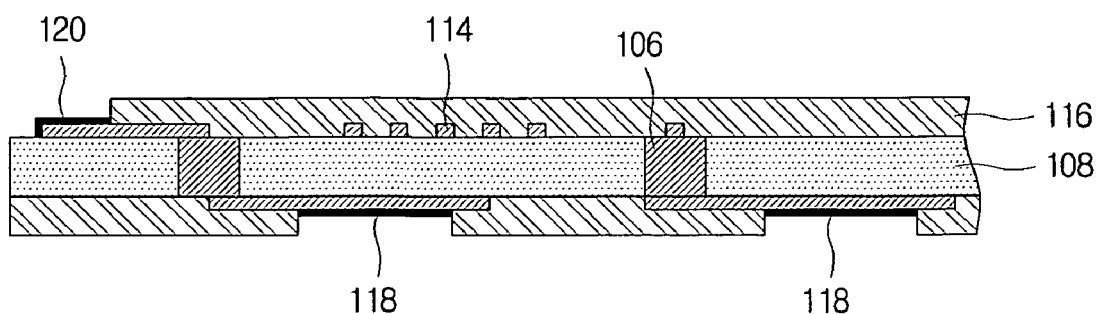
FIG. 41 is a cross-sectional view illustrating a printed circuit board according to an embodiment of the invention.
Figure 42:
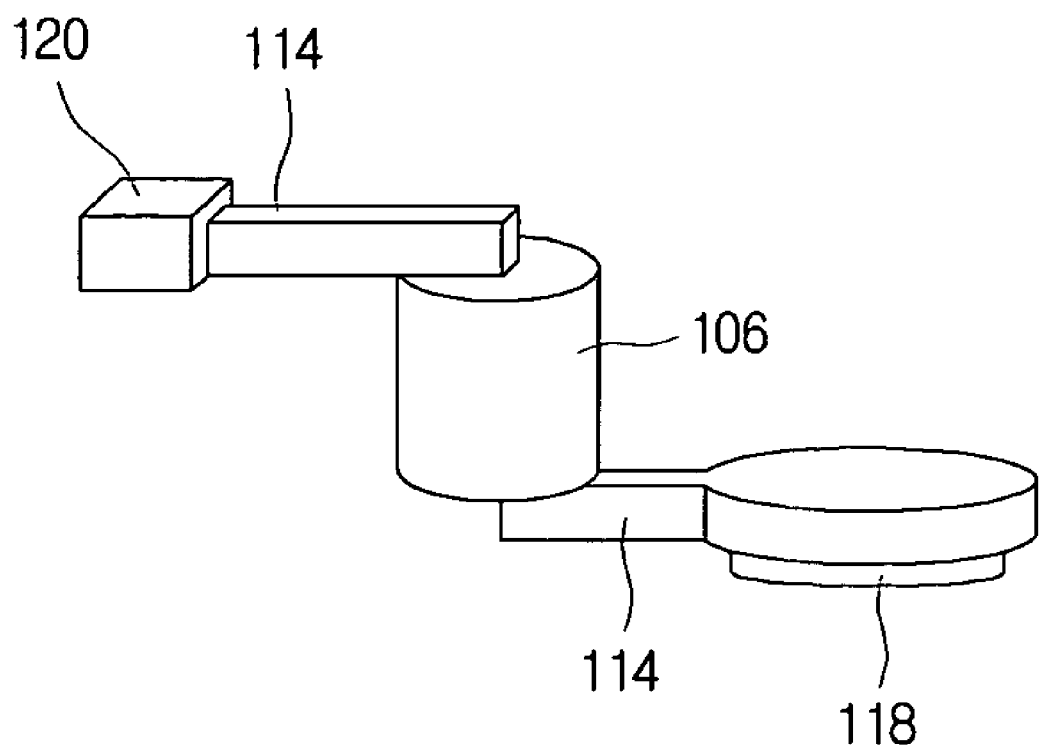
FIG. 42 is a perspective view illustrating a via and circuit patterns according to an embodiment of the invention.
Figure 43:
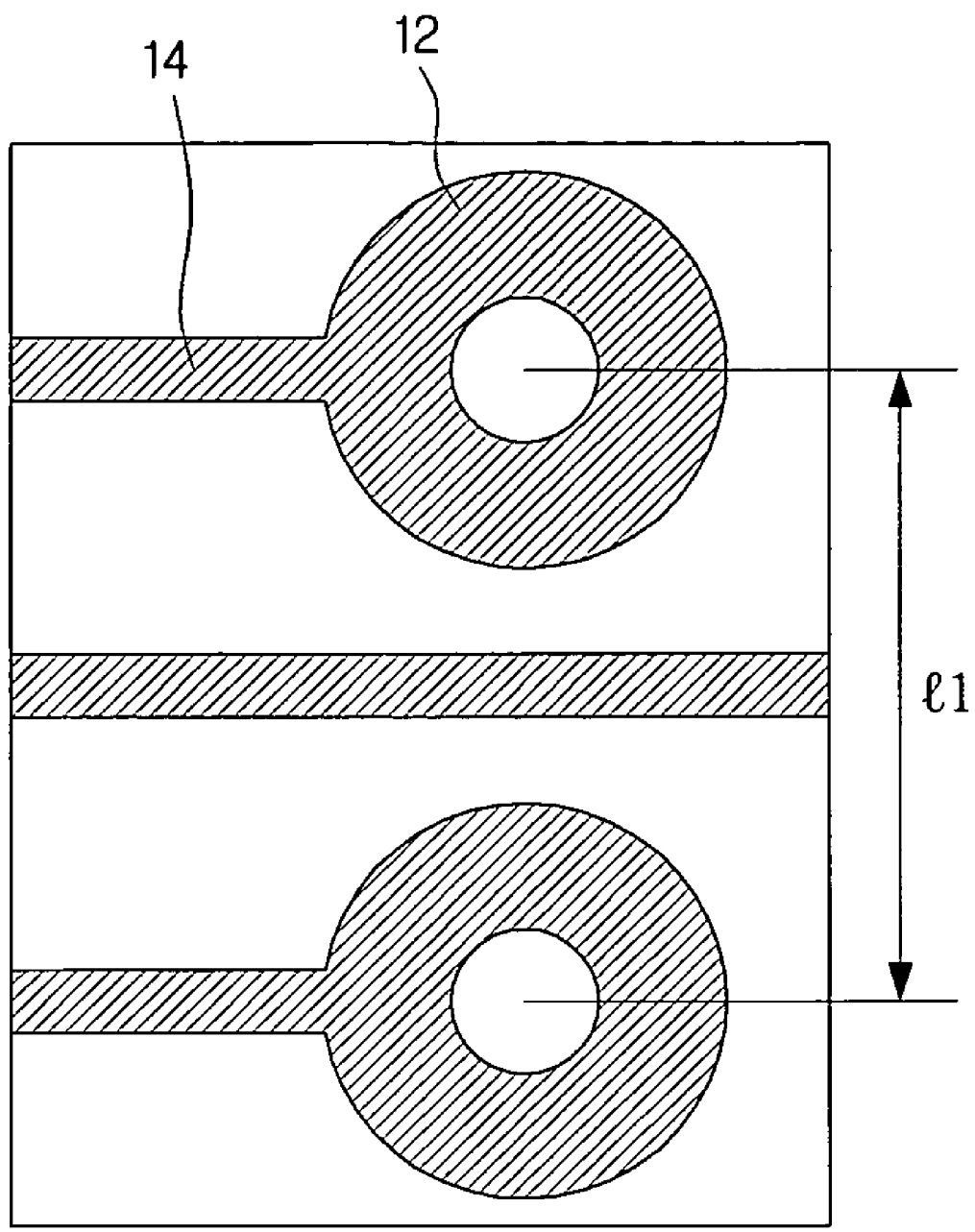
FIG. 43 is a plan view illustrating a printed circuit board according to the related art.
Figure 44:
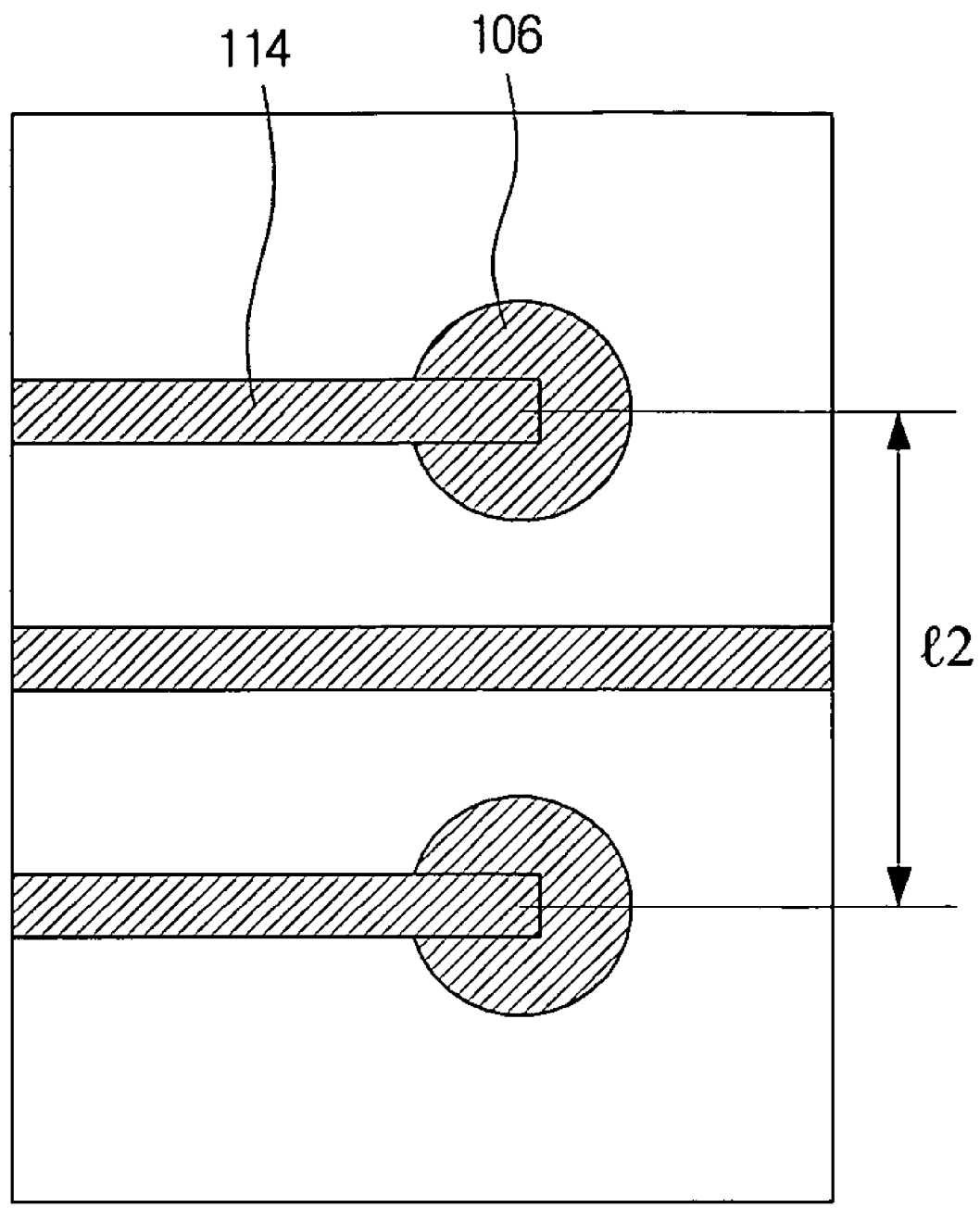
FIG. 44 is a plan view illustrating a printed circuit board according to an embodiment of the invention.

FIG. 41 is a cross-sectional view illustrating a printed circuit board according to an embodiment of the invention, and FIG. 42 is a perspective view illustrating a via and circuit patterns according to an embodiment of the invention. FIG. 43 is a plan view illustrating a printed circuit board according to the related art, and FIG. 44 is a plan view illustrating a printed circuit board according to an embodiment of the invention. In FIGS. 41 to 44 are illustrated insulation layers 108, interlayer connectors 106, circuit patterns 114, solder resists 116, a wire bonding pad 120, solder ball pads 118, and via lands 12.

Referring to FIGS. 41 and 42, a printed circuit board according to an embodiment of the invention can have the interlayer connectors 106 and circuit patterns 114 electrically connected without the use of via lands 12. By forming copper posts on carriers, stacking insulation layers 108 on such that the copper posts are exposed, and afterwards forming the circuit patterns 114, direct electrical connection may be implemented between the copper posts, i.e. the interlayer connectors 106, and the circuit patterns 114. Comparing FIG. 43 with FIG. 44, it can be seen that the gap l2 between circuit patterns 114 in a printed circuit board according to an embodiment of the invention has been reduced, due to the elimination of the via lands 12, compared to the gap l1 between circuit patterns 114 in the conventional printed circuit board having via lands 12. Consequently, the wiring density of the circuit patterns 114 can be increased.

As set forth in the descriptions above, certain aspects of the invention enable electrical connection between circuit patterns and vias without using lands, whereby the density of circuit patterns can be increased.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board having a first carrier and a second carrier, the method comprising:

forming at least one interlayer connector in a shape of a post on the first carrier;

placing an insulation layer between the first carrier formed with the interlayer connector and the second carrier;

pressing the first and second carriers together after the placing the insulation layer between the first carrier and the second carrier such that the interlayer connector passes through the insulation layer and is placed in physical contact against the second carrier;

removing the first and second carriers to expose the insulation layer; and forming at least one circuit pattern on the insulation layer such that the circuit pattern is electrically coupled with the interlayer connector.

2. The method of claim 1, wherein forming the interlayer connector comprises:

forming a plating resist on the first carrier, the plating resist being in correspondence with the interlayer connector;

forming the interlayer connector by plating the first carrier; and removing the plating resist.

3. The method of claim 1, wherein forming the interlayer connector comprises:

forming a conductive paste bump on the first carrier, the conductive paste bump being in correspondence with the interlayer connector; and curing the conductive paste bump to form the interlayer connector.

4. The method of claim 1, wherein a seed layer is formed on each of the first and second carriers, the seed layer being etchable by an etchant that is different from an etchant for the insulation connector;

and the method further comprises, between removing the carriers and forming the circuit pattern:

removing the seed layer.

5. The method of claim 1, further comprising, after forming the circuit pattern:

forming a solder resist exposing at least one portion of the circuit pattern; and forming at least one pad by plating the at least one portion.

* * * * *